US008279100B2

(12) United States Patent
Caci et al.

(10) Patent No.: US 8,279,100 B2
(45) Date of Patent: Oct. 2, 2012

(54) COMPLEX ANALOG TO DIGITAL CONVERTER (CADC) SYSTEM ON CHIP DOUBLE RATE ARCHITECTURE

(75) Inventors: J. Claude Caci, Baldwinsville, NY (US); Byron W. Tietjen, Baldwinsville, NY (US); Kevin H. Wilson, Baldwinsville, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 63 days.

(21) Appl. No.: 12/894,560

(22) Filed: Sep. 30, 2010

(65) Prior Publication Data
US 2012/0081246 A1 Apr. 5, 2012

(51) Int. Cl.
*H03M 1/12* (2006.01)
(52) U.S. Cl. .......................................... 341/155; 341/156
(58) Field of Classification Search .................. 341/118, 341/155, 156
See application file for complete search history.

(56) References Cited

U.S. PATENT DOCUMENTS

| | | | |
|---|---|---|---|
| 4,170,766 A | 10/1979 | Pridham et al. | |
| 4,316,187 A | 2/1982 | Spencer | |
| 4,893,316 A | 1/1990 | Janc et al. | |
| 5,272,438 A | 12/1993 | Stumme | |
| 5,535,240 A | 7/1996 | Carney et al. | |
| 5,642,052 A | 6/1997 | Earle | |
| 5,796,636 A | 8/1998 | Andrews | |
| 5,969,516 A | 10/1999 | Wottrich | |
| 6,034,726 A | 3/2000 | Hirota et al. | |
| 6,054,931 A | 4/2000 | Wottrich | |
| 6,072,317 A | 6/2000 | Mackenzie | |
| 6,218,844 B1 | 4/2001 | Wong et al. | |
| 6,246,225 B1 | 6/2001 | Schaefer | |
| 6,310,570 B1 * | 10/2001 | Rumreich et al. | ............ 341/155 |
| 6,462,555 B1 | 10/2002 | Schaefer | |
| 6,466,029 B2 | 10/2002 | Stroth et al. | |
| 6,781,381 B2 | 8/2004 | Parker | |
| 6,785,104 B2 | 8/2004 | Tallman et al. | |
| 6,850,073 B2 | 2/2005 | Elms et al. | |
| 7,027,942 B1 | 4/2006 | Woodard et al. | |
| 7,098,842 B2 | 8/2006 | Nakazawa et al. | |
| 7,106,071 B2 | 9/2006 | Pharn et al. | |
| 7,116,111 B2 | 10/2006 | Wyar | |
| 7,141,960 B2 | 11/2006 | Bystrom | |
| 7,145,972 B2 | 12/2006 | Kumar et al. | |
| 7,173,428 B2 | 2/2007 | Hurwicz | |
| 7,221,283 B1 | 5/2007 | Czarnecki | |
| 7,233,270 B2 * | 6/2007 | Lin | ............................... 341/118 |
| 7,236,338 B2 | 6/2007 | Hale et al. | |
| 7,245,129 B2 | 7/2007 | Wajcer et al. | |
| 7,532,684 B2 | 5/2009 | Tietjen | |
| 7,692,570 B2 | 4/2010 | Martellock et al. | |
| 7,705,761 B2 | 4/2010 | Tietjen et al. | |
| 7,961,123 B2 * | 6/2011 | Nagarajan et al. | ............ 341/118 |
| 2004/0029548 A1 | 2/2004 | Li | |
| 2005/0285766 A1 | 12/2005 | San et al. | |
| 2006/0007929 A1 | 1/2006 | Desai et al. | |
| 2006/0165198 A1 | 7/2006 | Tietjen | |
| 2007/0080843 A1 | 4/2007 | Lee et al. | |
| 2008/0036636 A1 | 2/2008 | Khorram | |
| 2009/0115650 A1 | 5/2009 | Tietjen et al. | |

* cited by examiner

*Primary Examiner* — Brian Young
(74) *Attorney, Agent, or Firm* — Howard IP Law Group, PC

(57) ABSTRACT

A Complex Analog to Digital Converter System on Chip (CADC SoC) implemented into a microcircuit system is provided. A series of stagger clock signals can be fixed on either a rising or falling edge of the system clock and a plurality of A/D converters can be grouped by sets (i.e. odd and even) and assigned to odd or even stagger clocks. A complex I&Q data manager is provided for controlling the system. A clock management system is responsive to an external signal to select from a set of stagger clock settings, thereby improving anti-alias performance.

28 Claims, 9 Drawing Sheets

COMPLEX ANALOG TO DIGITAL CONVERTER (CADC) SYSTEM ON CHIP DOUBLE RATE ARCHITECTURE

FIELD OF THE INVENTION

The present invention relates to signal processing in a digital radio receiver using analog to digital converters.

BACKGROUND

In the field of digital radio, choosing the point at which to convert from analog circuitry to digital processing may play a significant roll in system function and performance. Radio frequency signals carry baseband information that must be retrieved by the radio. The process of retrieving this information is performed by a radio and, ideally, by all-digital software defined radio (SDR). As is conventionally understood, SDR defines a collection of software technologies where some or all of the radio's operating functions (also referred to as physical layer processing) are implemented through modifiable software or firmware operating on programmable processing technologies. However the SDR is limited by the ability to digitally process the RF signals, as it is difficult to construct a circuit to convert RF signals from the antenna directly into data.

The analog to digital converter (A/D or ADC) is an electronic device that can convert a signal amplitude to a numerical value. These devices enable a central processing unit to carry out processing functions in the more precise mathematical domain directly from the antenna, instead of physical circuits utilizing discrete analog devices. In radio signal processing, recovery of baseband signal requires more than simply processing amplitude information. The frequency and phase of the RF signal must also be measured. The amplitude and phase, also referred to in the art as I&Q information, are critical to demodulation. The A/D converter must therefore provide the I&Q of the RF signal in the data it generates so the baseband can be recovered. Before that can happen however, the signal must be tuned at the antenna.

Present A/D conversion systems are too slow to directly digitize ultra high frequency and microwave RF signals. These systems must utilize several analog down conversion steps before the signal is sufficiently low in frequency to allow for digitization. In addition to limited or low sample rates, A/D converters further hinder signal processing operations due to their limited resolution, measured by the effective number of bits or ENOB.

Signal processing systems utilizing A/D converters, including complex A/D converters (CADCs), have various functionality requirements which may include a track and hold (T&H) of an analog input signal, and precision timing operations, in addition to the A/D conversion process. Clock generators, for example, are used to synchronize a T&H amplifier with an A/D converter. More specifically, the T&H amplifier follows an input analog signal of interest until a control signal from the clock causes the amplifier to freeze and hold the signal at an instant (for a short period of time). The same clock signal also strobes the A/D converter to convert the frozen sample to a digital value. This digital data can then be buffered and read out to memory for further processing. The time it takes for the T&H amplifier and A/D converter to perform the operation and be ready for the next value is the A/D sample rate. Over a given sample period, however, the radio frequency signal may change significantly. These changes may be lost due to the insufficient speed in the conversion process. For radio frequencies in the ultra high frequency (UHF) band, achievable Nyquist in band (first zone) direct A/D sampling is not possible for high performance signal processing operations, thus requiring one or more frequency down-conversion steps prior to digitizing the signal.

Time-staggered A/D converters may be designed at the circuit board level. They can be used to increase the sampling rate of an incoming radio frequency signal so that direct conversion at the RF level from the antenna is possible. However, time-staggered A/D converter arrays are performance limited by timing noise, particularly the stagger jitter which is transformed into phase and frequency error. Another noise source is that introduced by the multiplicity of A/D converters which do not perform identically for a given reference signal. Moreover, noise which results from pathway circuitry imperfections will affect the data samples as frequency or phase distortion. Thus, the three main sources of noise: stagger clock jitter, differences between A/D units, and imperfections in multiple signal pathways on the circuit board, may cause degradation in signal processing operations and overall radio communication performance.

Improved CADCs are desired which can increase the sampling rate for UHF signal processing and improve signal to noise ratios and overall signal processing performance.

SUMMARY

Embodiments of the present invention seek to directly digitize RF signals at the output of the antenna and reduce or eliminate analog down conversion steps in radio receiver processing. These embodiments may combine stagger clock jitter management, means of matching A/D converters to a single performance model and system management to significantly increase the performance of CADC systems. By moving the time staggered A/D concept from the circuit board level to the microchip level, it is possible to use established microchip design techniques to craft a system of small physical scale and make big improvements to time jitter. A system to add calibration of the multiple A/D converters may be implemented to apply an automatic correction factor to their output. This automatic correction enables each A/D converter output to fit an ideal (i.e. target) performance model. A system to organize the A/D converters into sets may be provided so as to arrange the converters to perform optimally for various signal processing tasks. These techniques will also address the three main points of performance degradation.

In an embodiment of the present invention an integrated circuit is provided having a clock phase generation device and a means to select a clock frequency having a rising edge and a falling edge. A means of generating a selectable and configurable clock frequency so as to have a choice between at least one of rising edge and falling edge timing may also be provided. A plurality of analog to digital converters are provided, each of which is coupled to one of the clock signals and configured to generate digital output data based on a corresponding clock signal and an analog input signal. A portion of the analog to digital converters are responsive to generate the digital output data on the rising edge of the clock signal, and a remaining portion of the analog to digital converters are responsive to generate the digital output data on the falling edge of the clock signal. The converters can also be configured to be all on the rising or falling edge of the clock signal. Such a selectable arrangement may be important for performing certain tuner features like TV receiver picture in picture and to signal processing algorithms.

Another embodiment of the present invention includes a clock management system configured to selectively alter a stagger period between clock signals generated by the clock phase generation device. This arrangement provides a system capable of adjusting the stagger step from the point of the rising or falling edge of the master clock according to a number of signal processing parameters.

In another embodiment of the present invention, a data management system is provided. The data management system is configured to receive and combine the sampled digital output data from each analog to digital converter. The data management system may arrange for a correction factor to be applied to the data output of each A/D converter so as to correspond in performance to an idealized model. More specifically, the data management system can arrange for a calibration signal to be applied to each of the A/D converters so they may be compared to the idealized model and compute the correction factor for each converter so that the adjustment can be made automatically in operation. The data management system may further improve down-stream processing by identifying each received portion of sampled digital output data. The identification process may be achieved by, for example, appending a unique address onto each digital output data sample. In another embodiment, a strobe signal may be provided on a separate pin that corresponds to the point in time that a specific A/D converter is on the serial line where one pin is provided for each A/D device and all data is on a serial output. Such an arrangement is said to be synchronized.

In another embodiment of the present invention, a method for improving the signal to noise ratio of a complex analog to digital converter is provided. The method includes the steps of generating a plurality of clock signals, each signal having a rising edge and a falling edge. The clock signals are provided to a plurality of A/D converters. These converters are operative to convert an analog input signal to a digital data stream. A portion of the converters are responsive to the rising edge of a respective clock signal and a remaining portion of the analog to digital converters are responsive to the falling edge of a respective clock signal for converting the analog input signal. The portion of A/D converters responsive to the rising and falling edges of the clock signal is controlled by the management system. For example, in a high definition television wherein one microchip embodies the entire TV tuner, it is possible to assign a smaller set of A/D converters to tune to another channel so as to provide picture in picture capability. The smaller picture would require less signal processing since it would have less picture elements to generate and the same would be true to some extent of the larger picture.

DETAILED DESCRIPTION

Figure 1:
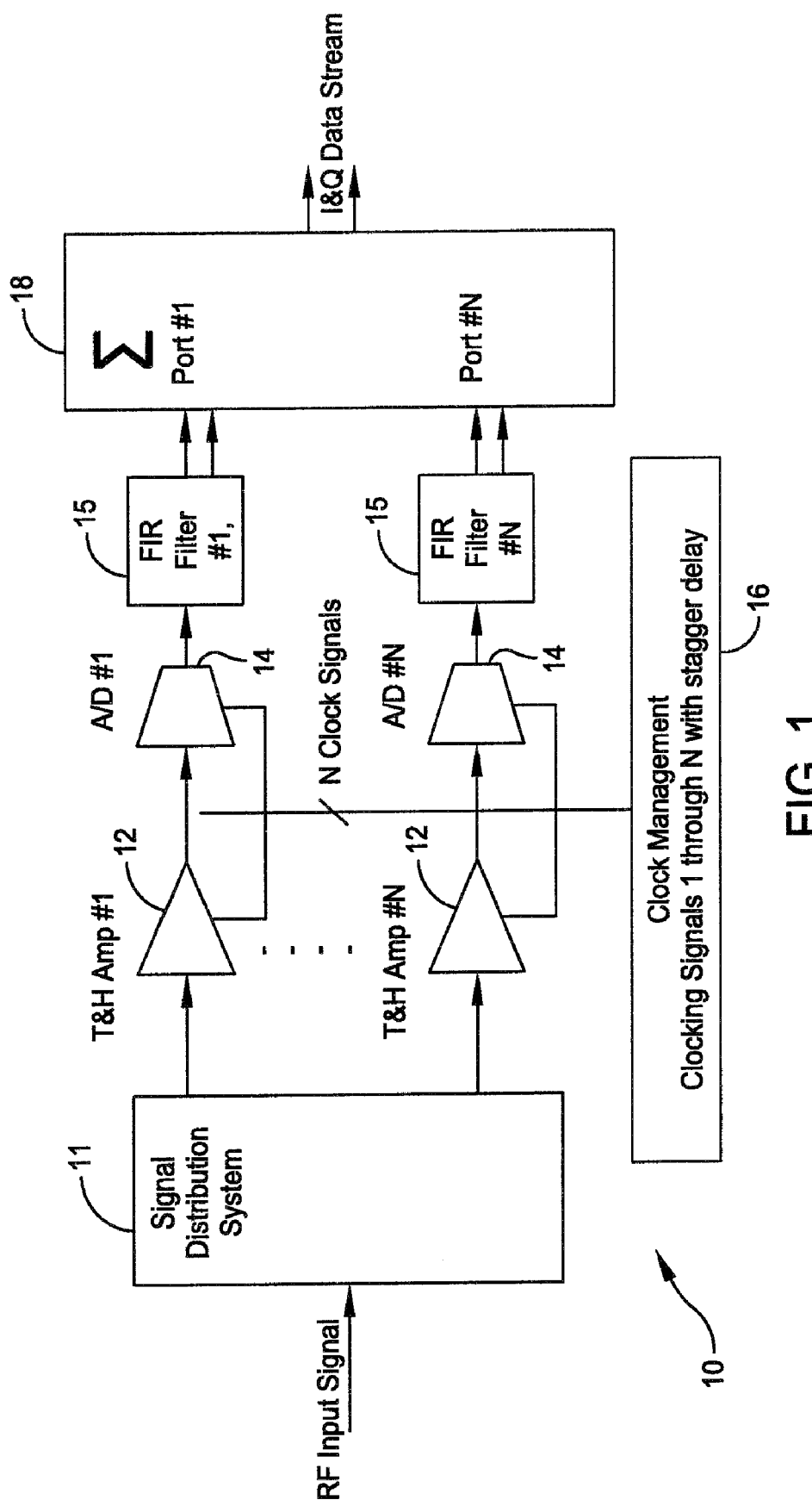
FIG. 1 is a block-diagram of a CADC useful for signal processing operations.

It is to be understood that the figures and descriptions of the present invention have been simplified to illustrate elements that are relevant for a clear understanding of the present invention, while eliminating, for purposes of clarity, many other elements found in typical A/D systems, such as system on chip A/D converters. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Referring generally to FIG. 1, an exemplary CADC 10 useful for describing embodiments of the present invention is shown. The CADC 10 includes a signal distribution system 11 configured to receive, for example, an RF input signal. The distribution system 11 allocates the RF signal to a series of T&H amplifiers (1-N) arranged in parallel, labeled generally as reference numeral 12. Each amplifier 12 receives an identical signal having a matched phase and amplitude. The output of each of the amplifiers 12 is provided to a corresponding one of the plurality of A/D converters (1-N), labeled generally as reference numeral 14, for converting the received analog signal to a digital data stream according to a predetermined sampling rate. In the exemplary embodiment, the amplifiers 12 and A/D converters 14 are arranged in pairs, with one amplifier 12 arranged in series with one A/D converter 14. As described in detail below with respect to FIG. 2, a clock management system 16 converts a clock signal (e.g. from a master clock) to successive, time-staggered signals for controlling the on and off timing of each amplifier 12 and A/D converter 14 pair.

Filters, such as finite impulse response (FIR) filters (1-N), labeled generally as reference numeral 15, are each arranged in series with the output of a corresponding A/D converter 14 and are operative to correct for amplitude and phase errors reflected within the digitized data output of the A/D converters 14. Filtered data is provided to an I&Q data manager 18 via ports 1-N. The data manger 18 combines the individual filtered A/D converter outputs into a common stream of I&Q data for further processing.

Figure 2:
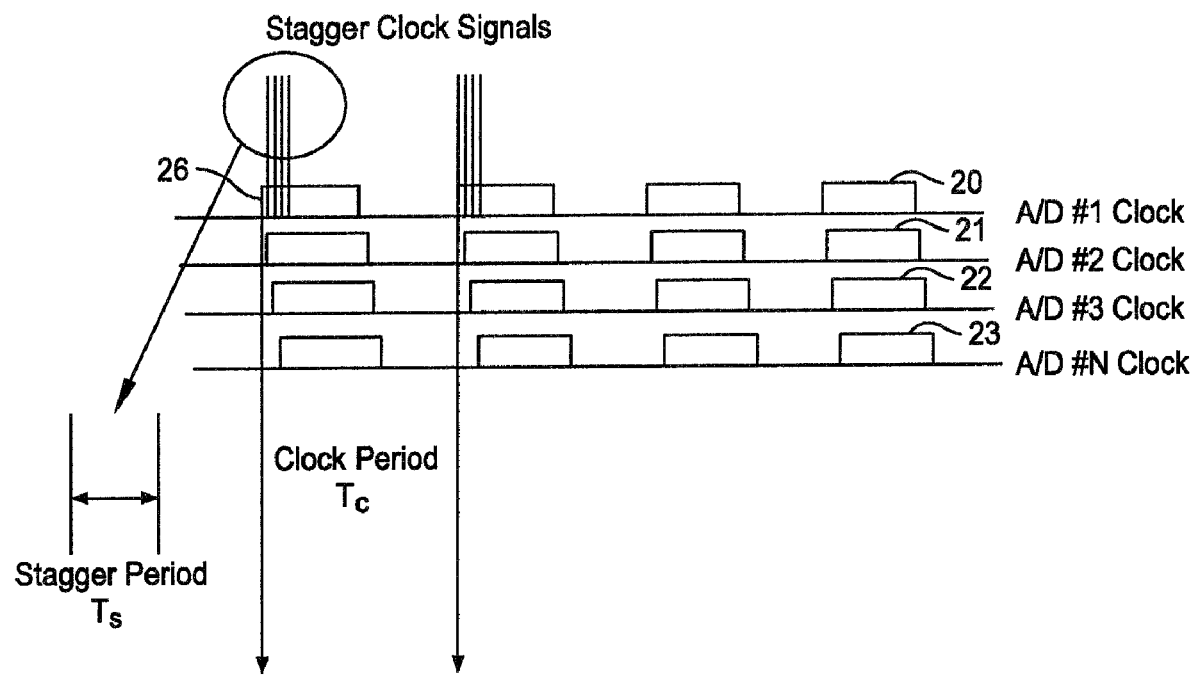
FIG. 2 is a representative view of a group of staggered clock signals which may be used to control the CADC of FIG. 1.

FIG. 2 shows an exemplary set of staggered clock signals 20-23 for controlling each amplifier 12 and A/D converter 14 pair of the CADC 10 described with respect to FIG. 1. Each clock signal defines a period $T_c$ and is operative to control the on and off timing of a given amplifier 12 and ND converter 14 pair. For example, the rising edge 26 of clock signal 20 is used to control the first amplifier 12 and the first A/D converter 14 of FIG. 1. Each successive signal 21-24 is staggered by a period $T_s$ with respect to the preceding signal, and is operative to control successive amplifier and A/D converter pairs. In an exemplary embodiment, each successive signal is staggered in time by a period ($T_S$) of $\frac{1}{2}F_{max}$, where $F_{ma}$ is the highest frequency component in the band of interest.

This staggered-clock arrangement is useful for controlling the multiple A/D converters required to effectively sample RF signals, including signals operating in the UHF band. However, due to imperfections in clock jitter circuitry, this arrangement produces timing jitter which results in errors in the sampling clock. This, in turn, causes errors in the signal to be sampled. In particular, jitter alters the normally uniform spacing of the sampling clock signal. The total jitter noise power for a sinusoidal signal may be expressed as:

$$Pj = 2\pi^2 F_0^2 A^2 \sigma_j^2 \qquad \text{eq. 1}$$

where A is the amplitude of the signal and $\sigma_j$ is the standard deviation of the jitter with $2\pi^2 F_0 \sigma_j < 1$. Not considering the effect of the FIR filters 15, the signal to noise ratio (SNR) from the jitter noise of the exemplary CADC 10 shown in FIG. 1 is represented by:

$$SNR_j = -20 \log(2\pi F_0 \sigma_j) \qquad \text{eq. 2}$$

However, a SNR gain can be realized by applying the FIR filter 15 to correct for amplitude and phase errors among the A/D converters 14. The gain achieved by the filters is about one-half the reciprocal of the normalized filter bandwidth, or approximately:

$$10 \log(N/2) \qquad \text{eq. 3}$$

where N represents the number of A/D converters employed. The full $SNR_j$ is then:

$$SNR_j = -20 \log(2\pi F0 \sigma_j) + 10 \log(N/2) \qquad \text{eq. 4}$$

This SNR representation assumes that each amplifier 12 and A/D converter 14 pair is triggered in sequence, beginning with the first pair (1) and ending with the pair (N).

It has been realized that by implementing CADC systems, such as those shown and described herein, into microcircuit form (i.e. system-on-chip, or SoC), rather than discrete or circuit-board form, reductions in this timing jitter are realized. As a microcircuit contains circuit lengths that are orders of magnitude shorter than equivalent discrete circuits, electromagnetic signal interference and cross-talk between board trace lines may be reduced significantly. Thus, an improvement is made to the $\sigma_j$ term of eq. 4. However, additional improvements to the gain defined by the 10 log(N/2) term of eq. 4 can be realized by implementing new control and grouping arrangements to the system described above with respect to FIG. 1.

Aspects of double data rate (DDR) architecture, such as that used in some random access memory (RAM) devices, include a clock system which may provide control signals on both the rising edge and the falling edge of a given clock signal. This clocking arrangement may be advantageously implemented into embodiments of the CADC of FIG. 1 in order to achieve SNR gains for a given number of A/D converters without increasing the sampling rate of the system.

Specifically, the clock arrangement shown in FIG. 2 uses only the rising edge 26 of each clock signal 20-23 to control each A/D conversion channel.

Figure 3:
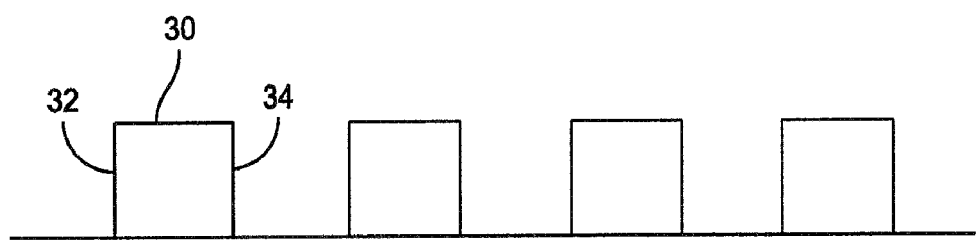
FIG. 3 is a representative view of a clock timing signal useful for describing aspects of the present invention.

Referring generally to FIG. 3, a clock signal according to embodiments of the present invention uses the rising edge 32 or the falling edge 34 of a given clock signal 30 to control the amplifiers and A/D converters of the system. In this way, for a given clock period T, and thus for each clock cycle, there are two clock signals available to strobe components of the CADC.

Figure 4:
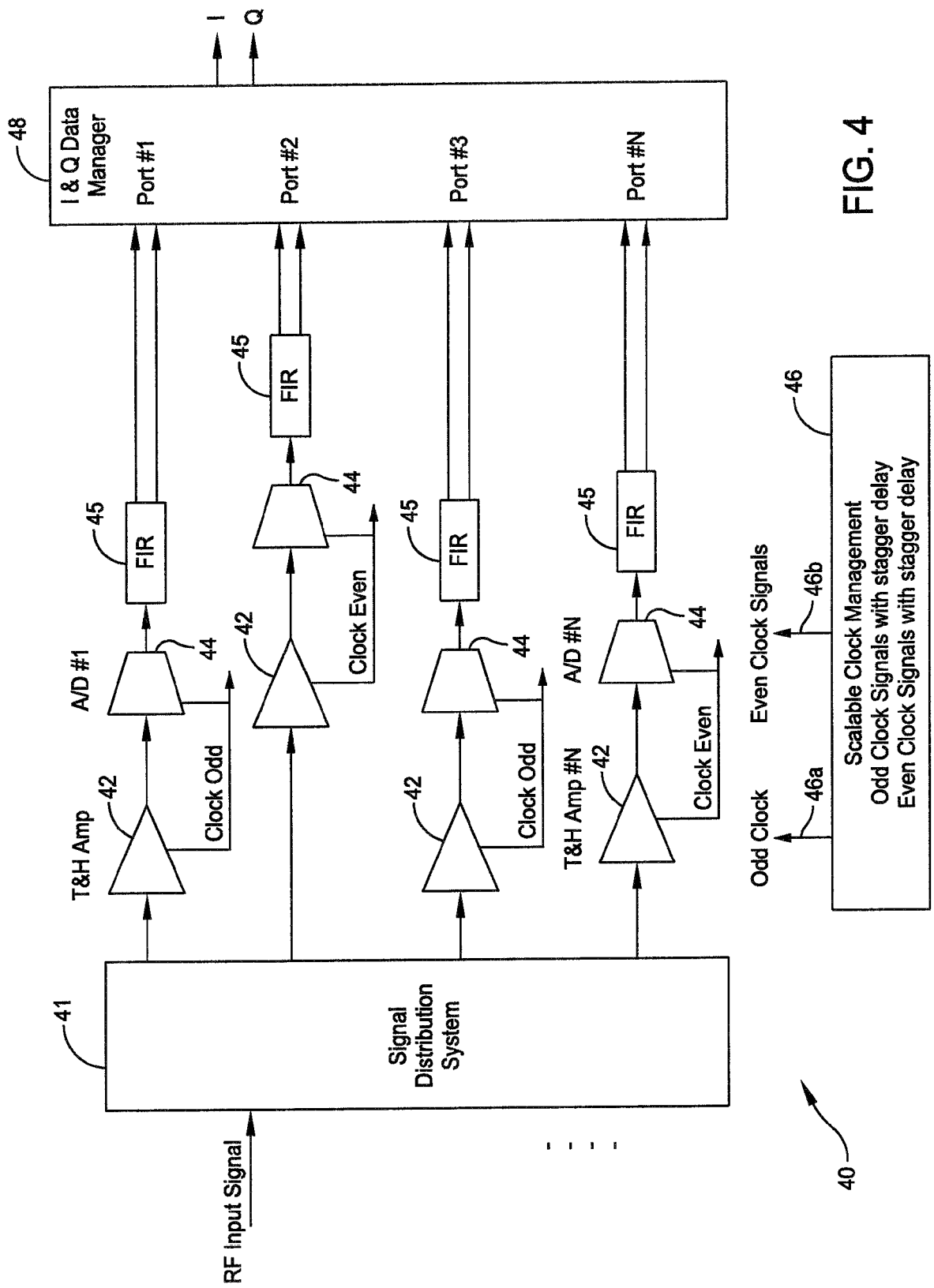
FIG. 4 is a block diagram of a CADC according to an embodiment of the present invention.

Referring generally to FIG. 4, an embodiment of a CADC utilizing this timing arrangement is shown and described. The exemplary CADC 40 comprises a signal distribution system 41 configured to receive an input signal, for example, an RF input signal, and output respective identical analog signals to a plurality of T&H amplifiers 42 (1-N). While the use of T&H amplifiers is shown and described, it is envisioned that various other components may be used to accomplish an equivalent function, including A/D converters which possess the ability to perform similar sample and hold operations without the need for separate amplifiers. Such devices may use a slow wave structure to capture a portion of the signal in time so digital comparators can sample it within the comparator clock period. As will be understood by one of ordinary skill in the art, a slow wave structure or delay line may be constructed from a series of logic gates and used to gradually amplify the difference of a signal within a clock period. It can be a microcircuit structure such that the delay value is proportional to the sample voltage amplitude. A larger amplitude will have more delay or be slower on such a line than a lower level signal. This property can then be used by the comparator logic to improve the digital resolution of the input sample.

The output of each amplifier 42 is supplied to respective A/D converters (1-N), 44, which provide digitized data sequences to filtering elements, such as FIR filters 45. The filtered digital data is provided to an I&Q data manager 48 via ports 1-N.

The system of FIG. 4 takes advantage of the above-described DDR timing scheme by arranging the T&H amplifiers 42 and A/D converters 44 in what can be described as odd and even pairs. For example, the first amplifier 42 and the first A/D converter 44 comprise an odd pair. The second amplifier 42 and the second A/D converter 44 comprise an even pair. This arrangement continues to alternate for N amplifier and A/D converter pairs as shown in FIG. 4. Each of the odd and even pairs is controlled by respective control signals 46a, 46b generated by a scalable clock management system 46.

Figure 5:
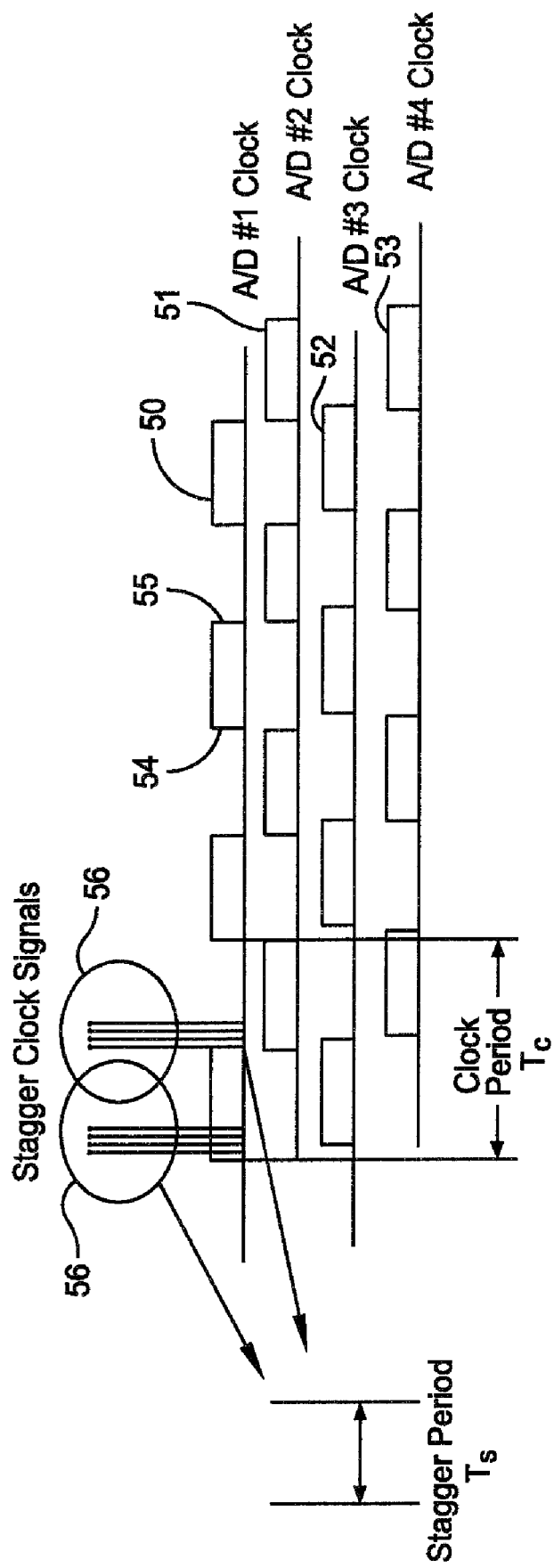
FIG. 5 is a representative view of a group of staggered clock signals which may be used to control the CADC of FIG. 4.

FIG. 5 shows an exemplary group of clock signals useful for controlling the above-described arrangement. Each of the staggered clock signals 50-53 comprises a rising edge 54 and a falling edge 55. As described above with respect to FIG. 3, the rising and falling edges of each clock signal 50-53 can be used to create two strobing signals 56 within each clock period $T_c$. These two signals can be used to control both an odd and an even T&H amplifier and A/D converter pair for each clock signal 50-53. More specifically, with reference to FIG. 4, the first amplifier 42 and A/D converter 44 comprising the first odd pair may be strobed off the rising edge 54 of the clock signal 50. The first even pair comprising the second amplifier 42 and the second A/D converter 44 may be strobed off the falling edge 55 of the second clock signal 51. Subsequent clock signals 52, 53, . . . N are used to control the respective amplifier and converter pairs 3, 4, . . . N may be time-staggered with respect to the base first clock signal 50 as described above with respect to FIG. 2.

As there are now two stagger clocks within a clock period $T_c$, the $SNR_j$ expression (eq. 4) becomes:

$$SNR_j = -20 \log(2\pi F0\sigma_j) + [10 \log(N_{even}/4) + 10 \log(N_{odd}/4)] \quad \text{eq. 5}$$

The log of N is not a linear function. Thus, dividing the number of A/D units in half (odd and even units) and assigning each group an independent jitter sequence results in an improvement to the SNR.

Table 1 shows the improvement between the two architectures:

TABLE 1

Architecture Comparison

| N | N/2 | 10 * log(N/2) | 10 * log($N_{odd}$/4) + 10 * log($N_{even}$/4) | Improvement dB |
|---|---|---|---|---|
| 12 | 6 | 7.781512504 | 9.542425094 | 1.760912591 |
| 16 | 8 | 9.03089987 | 12.04119983 | 3.010299957 |
| 20 | 10 | 10 | 13.97940009 | 3.979400087 |
| 24 | 12 | 10.79181246 | 15.56302501 | 4.771212547 |

N represents a sample number of A/D converters in the CADC system, $N_{even}$ and $N_{odd}$ represent the CADC reorganized using the rising and falling edge clock signals as shown in FIGS. 4 and 5. The stagger period $T_s$ is the same value in both cases. By reorganizing the A/D converters into odd and even units, each assigned to a group strobed by the sampling clock's rising and falling edge, a measureable SNR improvement has been achieved. In summary, the jitter variance on the rising edge is not correlated to the jitter variance on the falling edge. However, the signal is the same in both sets, so there is correlation for the signal but not for the noise. In this way, the average of the two sets will diminish this type of noise, thus improving the SNR.

It is further envisioned that a system according to embodiments of the present invention may be implemented in multiple operational modes. In a first, or straight data mode, each A/D converter may be triggered off of the rising edge of respective staggered clock signals. Further, as described above, in a second, or double data rate mode, half of the A/D converters may be triggered off of the rising edge of a clock signal, and the remaining half on the falling edge, with each successive A/D converter controlled by staggered clock signals.

As a result of the reorganization of the A/D converters and the implementation of the above-described timing arrangement, it may be advantageous to implement further processing into the CADC to de-interleave the data stream to facilitate further processing of the converted data. Specifically, with data now organized into two sets of odd and even data streams, an advantageous de-interleaving process may implement a means to identify the specific A/D converter and its respective sequencing.

Still referring to FIG. 4, the I&Q data manager 48 is operative to perform the above-described tasks. In one embodiment, the data manger 48 may append an identifier (ID) or unique address to a data word output by the A/D converter 44 to enable downstream sort/detection of the data by time relationships within a data stream set. As will be set forth in more detail with respect to FIG. 7, the data manager 48 also may comprise a reset function to initialize the odd and/or even set.

An exemplary identification operation performable by the data manager 48 is described herein. For example, each A/D converter may provide 12 or 16 bits of signal data per sample. For a CADC system that utilizes a data word size of 16 bits, 4 data bits are allocated for ID and 12 are allocated for data. If 16 bits of data are used and 4 bits allocated for ID, then the data word size is 20 bits. These 4 bits may be implemented as a 4-bit address field used to identify $2^4$ or 16 A/D converters. In the event the architecture requires additional A/D converters, then the size of the data word address field may be increased (for example, to 5 bits) to increase the number of A/D converters that can be identified (e.g. to 32). While a particular data word and ID length is described, it is envisioned that any suitable memory configuration can be implemented for various word sizes. For example, in a field-programmable gate array (FPGA) environment or even in a single board computer, memory can be configured and organized to a given size.

Figure 6:
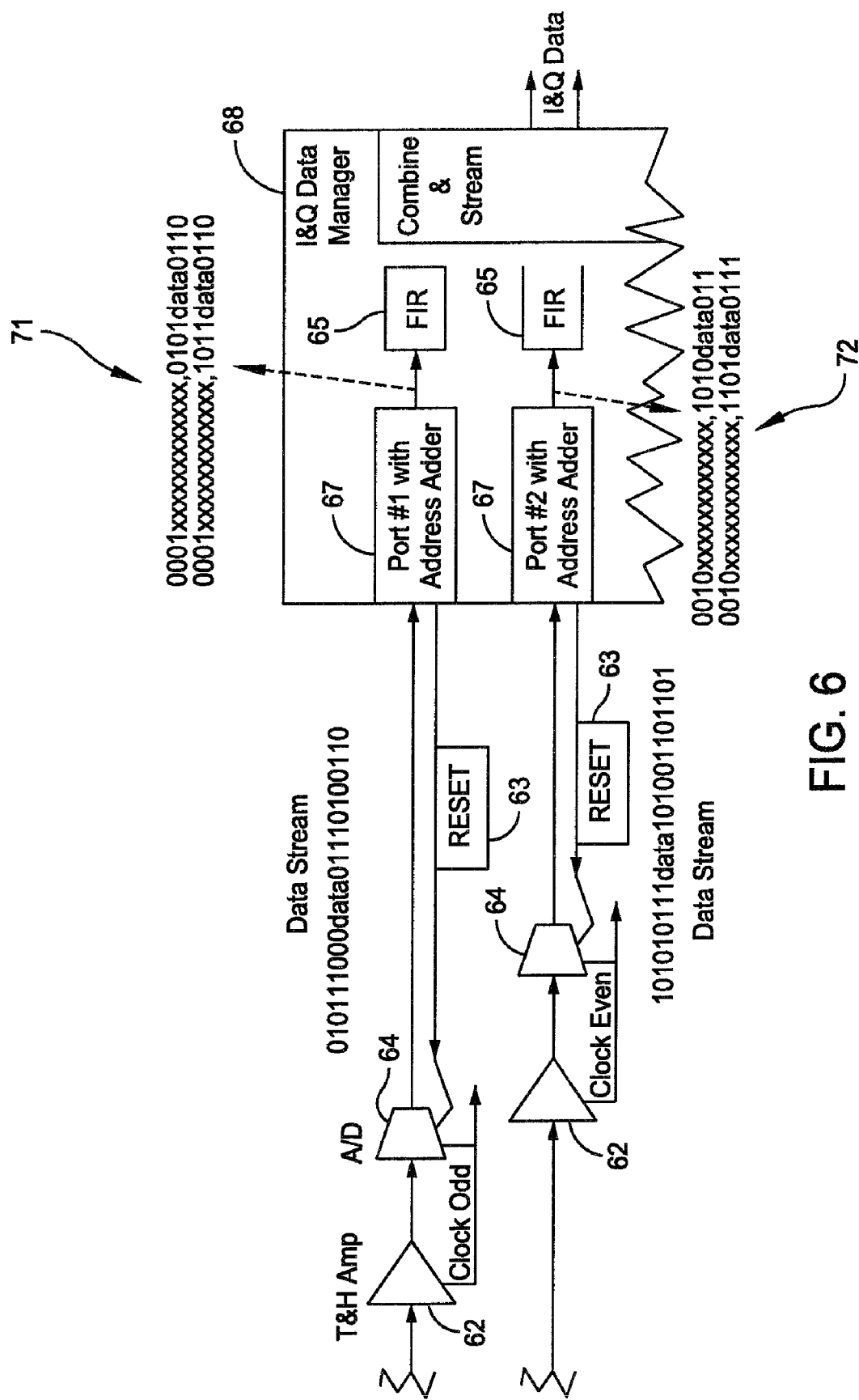
FIG. 6 is a block-diagram of an embodiment of the present invention showing the flow of data through the CDAC system.

FIG. 6 shows an exemplary system in which the I&Q data manager 68 is operable to append an address to a received data stream. As described above with respect to FIG. 4, odd and even pairs of T&H amplifiers 62 and A/D converters 64 are responsive to a received analog signal and operate to produce sequences of digitized data to the data manager 68. The data manager 68 may comprise address adders 67 configured to append an ID, for example, a 4-bit ID, onto these data sequences as described above. Each of the address adders 67 may also comprise the ability to issue a reset signal 63 to respective A/D converters. This reset signal 63 improves the address adder's ability to distinguish data word boundaries.

The I&Q data manager 68 includes a number of control logic functions operative to, for example, coordinate and synchronize the reset signals 63 between the A/D converters 64 in an odd or even set. Thus, the data manger 68 possesses the ability to coordinate the time line when starting a sequence.

For example, the 4-bit binary address for the first A/D converter 64 may be 0001, and 0010 for the second A/D converter 64. These addresses may be appended onto, for example, the front end of a given data sequence. The resulting ID data sequences 71,72 shown in FIG. 6 have been marked with a comma within the data stream for purpose of illustration. The 'xxxxxxxxxx' portion of each data sequence represents an additional sequence field that will be described below.

In the embodiment of FIG. 6, the FIR filters 65 are part of the I&Q data manager 68 and are operative to filter the incoming data after the address has been appended by the address adders 67. The filtering operation is improved as a result of this implementation after the ID address has been incorporated into the data. The output of the CADC SoC is the first step in signal processing as required to operate a tuner in a software defined receiver. The next step is to provide suitable filtering of the data.

As set forth above, embodiments of the system of the present invention may be implemented at the microchip level, wherein processing limitations are proportional to available area on a given chip, as well as power and thermal requirements and capabilities. In order to overcome these design limitations, the filters may be implemented in a second chip tightly coupled to the CADC SoC by, for example, a field-programmable gate array (FPGA) or application-specific integrated circuit (ASIC). As understood by one of ordinary skill in the art, tightly coupled circuits are circuits wherein a sending transistor and receiving transistor are very close in terms of wavelength between them. At very high data transition speeds, the movement of charge on a conductor can pull the receiving transistor into a bias region where it can no longer detect logic one and logic zero transitions based on the rules of transition encoding. A long conductor will be more likely to develop such a charge compared to a shorter conductor. Long strings of logic ones or zeros will tend to pull the conductor with a charge. Under these conditions, rules of data whitening are needed so that the average number of ones and zeros are about equal. These data whitening rules use transition encoding and data framing to make sure the change imbalance between sending and receiving transistor cannot occur. An imbalance of data will cause a charge to form so transition encoding and data frames may be required as when chips are adjacently positioned on a circuit board. Transition encoding schemas are sometimes referred to as non-return to zero (NRZ) or return to zero and alternate mark inversion (AMI). These codes can handle longer strings of successive ones and zeros without building up a charge. Very long sequences of ones or zeros are changed in the data frame to be codes that represent them. The data frame requires more microchip logic to implement. However, if an arrangement is made wherein the chips are stacked one on another, the circuit distance is small and these data frames may not be required. They may also not be required if the chips are positioned directly one behind the other on the circuit board so the circuits go through the board rather than across the board.

Figure 9:
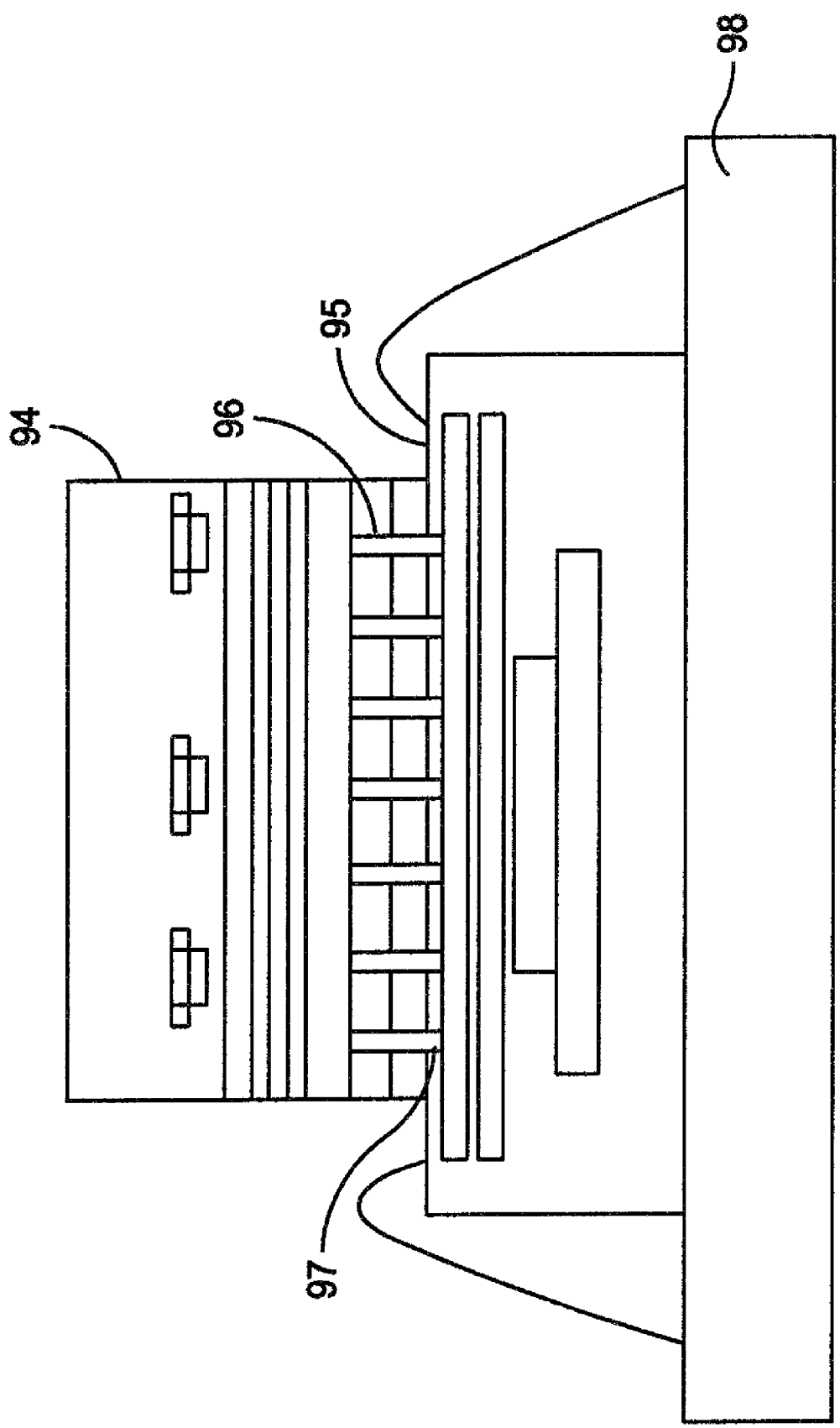
FIG. 9 is a perspective view of an exemplary system-on-chip arrangement according to an embodiment of the present invention.

It is further envisioned that the arrangement may also be implemented by a single board computer with a general type central processing unit (CPU) with random access memory and storage for the program. Yet another way to implement the filter, specifically, is to arrange both the filter and the CADC system in a three-dimensional fashion on a single chip. Referring generally to FIG. 9, an embodiment of the present invention implemented in three dimensions onto a chip is shown. A filtering arrangement 95 is provided on the surface of a substrate 98. The CADC SoC 94 may be arranged on a top of the filter arrangement 95, as shown schematically by the vertical arrangement between the CADC SoC 94 relative to the filtering arrangement 95. Communication between the CADC SoC 94 and the filtering arrangement 95 is achieved through vias 96 provided between the CADC SoC 94 and pads 97 on the filter arrangement 95. In this way, the implementation takes on a three-dimensional construction, allowing for additional components to be arranged on a chip of a given area compared to traditional two-dimensional arrangements.

This embodiment allows high speed data (e.g. gigabit per second data rates) to move from the CADC SoC 94 to the filters 95 over short, intra chip distances. While connections across chips at the circuit board level typically require additional processes such as encoding and framing, such additional processes may not be needed in a three-dimensional microchip package implementation. It is further envisioned that the process of serializing the data from the CADC SoC 94 to the filter arrangement 95 may also be implemented as a series of parallel circuits.

Organizing data using this digital signal processing function improves the system's ability to sort received data for further processing. Specifically, when the analog RF signal is input into an A/D converter, the output is a stream of numbers at the A/D clock frequency $F_c$. The use of a plurality of time-staggered A/D converters provides multiple ways to organize the output as a result of the two unique clocks. The first clock is $F_c$, the A/D converter basic clock rate, and the second clock is $F_s$, or the staggered clock rate. For example, consider an A/D converter having a basic clock rate of 500 MHz. The period of the clock rate is 1/Fc or 0.000000002 ($2*10^{-9}$) seconds. If the stagger clock $T_s$ is 125 picoseconds then the frequency is $1/T_s$ or 8 GHz. Following the Nyquist rule, the effective maximum tunable frequency is one-half the sampling frequency, or 4 GHz. These two clock rates enable processing of both the RF signal directly, as well as the corresponding baseband. However, the bandwidth is largely fixed by the sample rate and a decimation value. It is also desired to guard against aliasing errors. To accomplish this, it is useful to satisfy the Nyquist criterion.

Decimation is a signal processing technique using, for example, an algorithm for reducing the number of samples of a discrete time signal. An embodiment of the invention may aid in this decimation process, by organizing the CADC data into Cycles and Epics. A Cycle represents the baseband symbol and an Epic represents a RF data stream sequence. More particularly, the baseband symbol unit time is an Epic and represents a number of RF samples. The Cycle is the baseband time for a symbol to change.

The data field can be organized within the I&Q data manager 68 so as to append the Epic series represented by 'x' in FIG. 6. Downstream processing will be improved if the A/D converter address and Epic # are sequenced in this manner. A Cycle is easily identified by a constant address. This means that the data stream of a single A/D converter running at the $F_c$ clock rate can be used to process baseband signals. Downstream processing modules can read the information within the output I&Q data stream of the data manager 68 and pick out the values pertinent for the decimation algorithm. Therefore between the Epic samples and Cycle samples, a complete detection and demodulation processing algorithm can be implemented.

Figure 7:
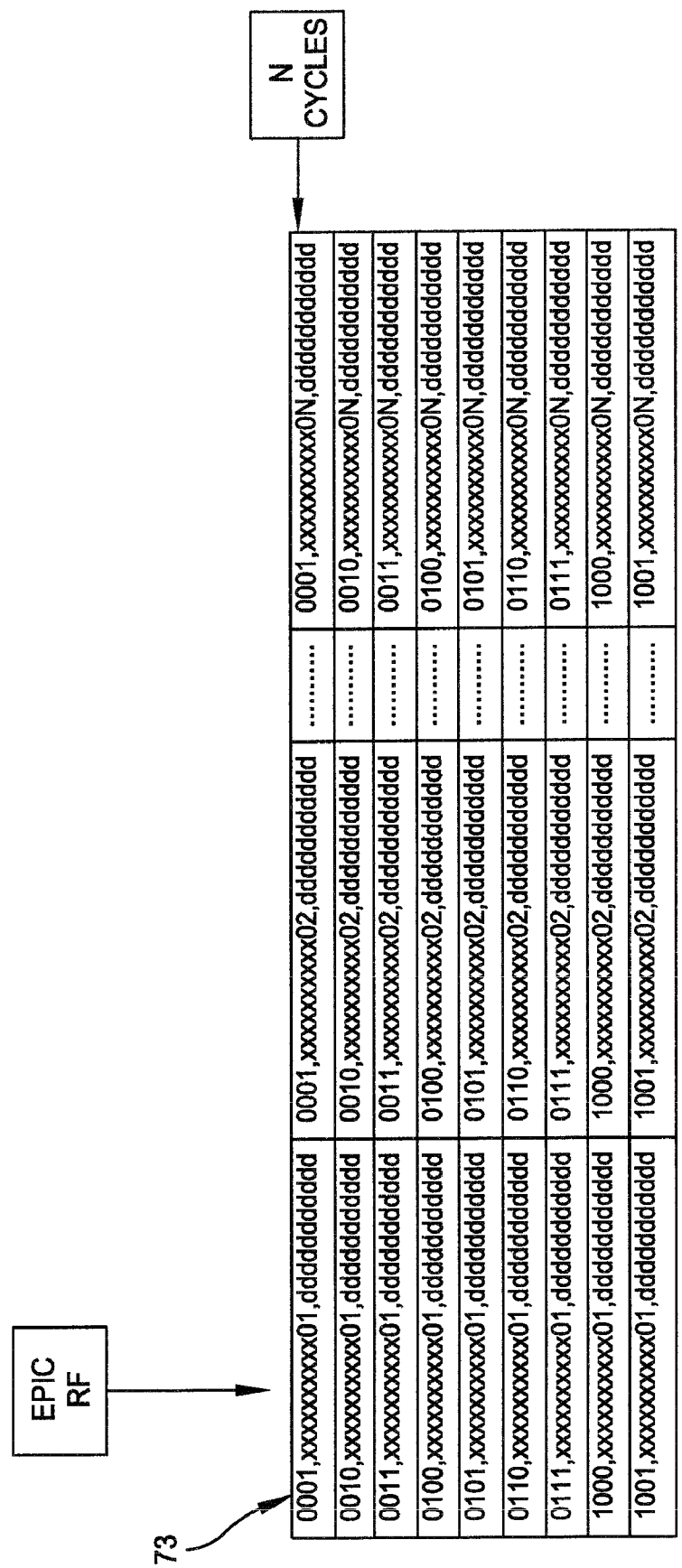
FIG. 7 is a table showing an exemplary identification and organizational arrangement of converted data.

FIG. 7 shows an example of how data can be organized in an I&Q data manager to facilitate this concurrent and baseband processing. As set forth above, the concept of Epic and Cycle is useful for organizing how data is stored in memory and processed in an decimation algorithm and for a baseband demodulation algorithm executing currently with an RF processing algorithm. In FIG. 7, the first 4-bit binary number 73 represents the A/D converter address. If the A/D converters are grouped by odd and even numbers, the second A/D converter is on the second stagger clock. Thus, it is possible to reorganize the table so that only odd A/D converters are grouped in a list followed by even A/D converters in a second list. If the A/D converters are sorted by odd numbers, then even A/D converters would be grouped in a second sequential list. Moving across the table by row represents data obtained with the $F_c$ clock (samples taken at the A/D converter clock rate). Moving down the column represents data taken by the $F_s$ clock (staggered clock rate). As described above, even A/D converter addresses can represent the falling edges and odd A/D addresses can represent the rising edges. This organizational arrangement improves performance of bandpass filtering and decimation.

Figure 8:
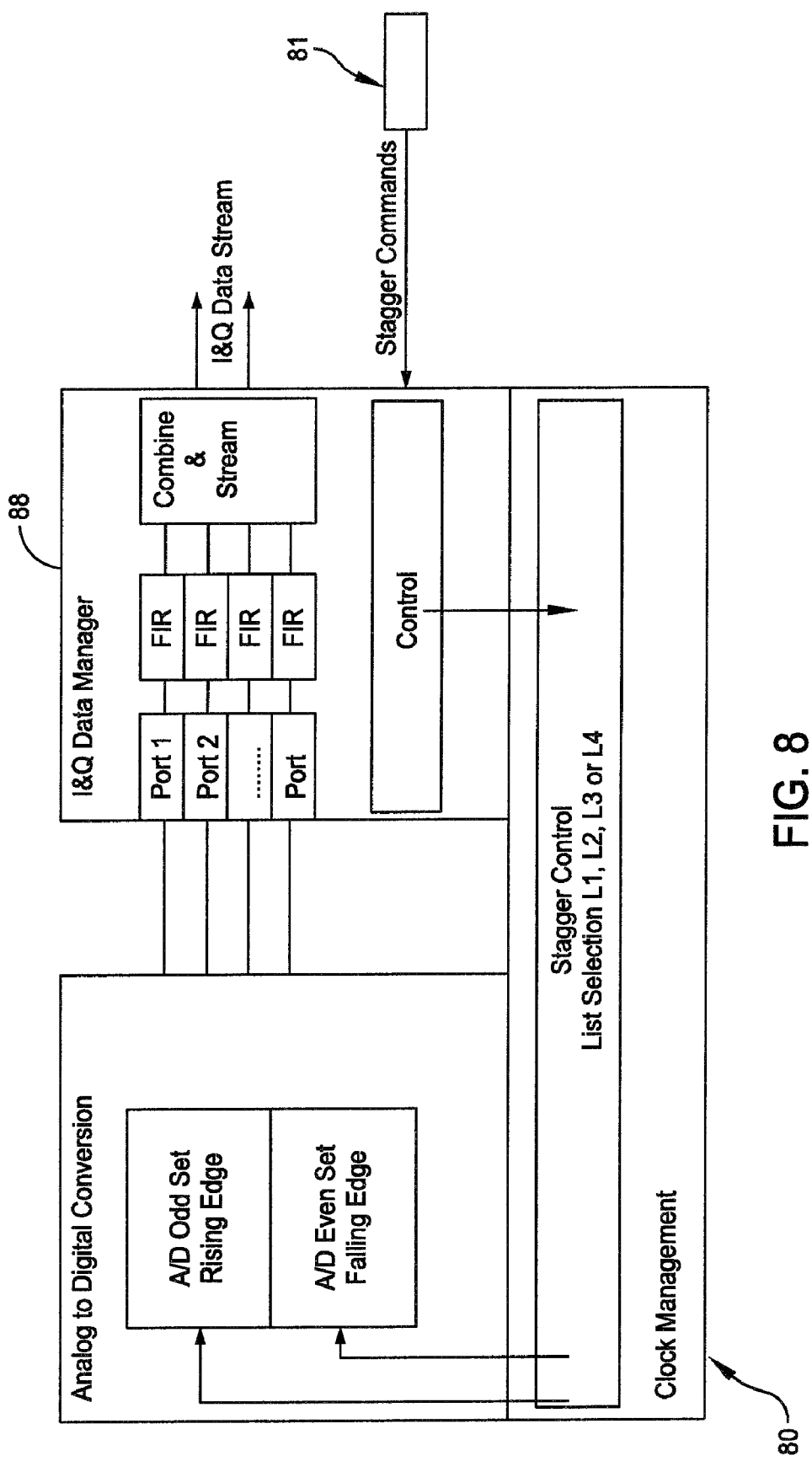
FIG. 8 is a block diagram of an A/D converter system according to another embodiment of the present invention.

A clock management system may be implemented which enables the choice of a stagger clock frequency from a set, or designate an aggregating increase by choosing a stagger clock. In this way, the system provides a means to adjust the first Nyquist band. FIG. 8 shows how a clock management system 80 may be added to a CADC to improve performance. For example, if 4 staggered clock set values of 125, 375, 625 and 875 picoseconds are implemented, L1-L4, a downstream processor 81 may provide a command to select an appropriate staggered clock value based on a number of signal processing parameters, for example, to target a specific dynamic range. If the processing task requires dynamic range or a larger number of effective bits then the I&Q data manager 88 may select the appropriate stagger clock to increase dynamic range over the highest frequency. For example, in a radio receiver, the density of signals in a frequency range may require higher dynamic range. Accordingly, it may be advantageous to trade effective number of bits for sample rate. Digital methods for implementing multiplying and counting circuits, as well as frequency converting circuits are known and thus have not been described herein.

The practical tuning effects of using a stagger clocking arrangement based on rising and falling edge will be described in an example to show the many tuning capabilities from this grouping and clocking arrangement. In the example, two A/D converters operating on a 500 MHz are provided. The clock is a square wave with a rising edge and falling edge on each square above and below the zero voltage reference line. The period is provided as $2 \times 10^{-9}$ seconds (the inverse of 500 MHz). It is understood that the Nyquist rate is two times the bandwidth of a band limited signal. If only the upper or lower portion of the clock signal is chosen as the timing reference, then this period is now one-half or $1 \times 10^{-9}$ seconds, effectively a 1 GHz clock. If one rising edge and one falling edge is allocated for controlling each A/D converter then the bandwidth of the system has effectively doubled from that of a single A/D converter. If additional A/D converters are implemented into the system along with a means to control the clock stagger, the repeat and delay of each rising or falling edge signal for each A/D converter may be achieved. If the repeat and delay of the clock signal occur at pico second ($10^{-12}$ seconds) intervals, which is easier at the microchip scale and more difficult at the circuit board level, then the Nyquist restriction on A/D sampling rates associated with a single device can effectively be eliminated. The number of samples needed at picoseconds intervals to generate an accurate frequency will influence how many A/D devices are chosen to be used in a microcircuit chip.

Figure 10:
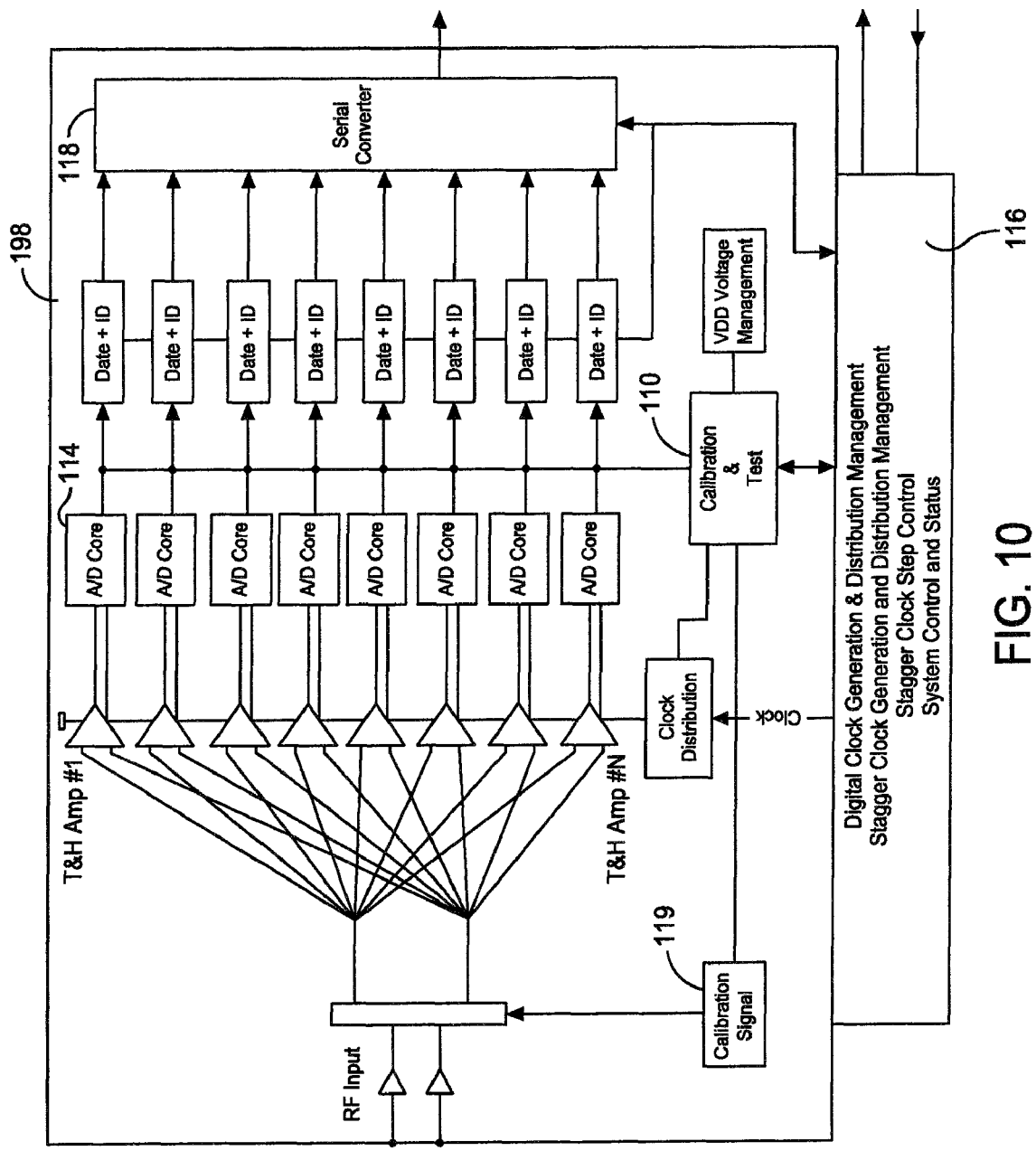
FIG. 10 is a block diagram of a CADC system according to another embodiment of the present invention.

Continuing the example, and referring generally to FIG. 10, a set of 8 A/D converters 114 is provided and organize onto a microchip 198. Each converter 114 is managed by an onboard control system 116. The onboard control system 116 may be provided with the reference model and ideal specifications of each A/D converter 114. From this information, the control system 116 and a calibration and test unit 110 may generate a calibration signal 119 to provide to each converter 114 for correcting any unwanted variations in the output of each converter 114.

Since it is difficult if not impossible to recognize one converter 114 from another when streaming on a serial output line provided by a serial converter 118, an identifying means, such as that described above with respect to FIG. 6 is added to identify each converter 114. If a converter 114 were to fail for example, it is possible to shut it down so the system could still operate albeit in a slightly degraded mode. For example a converter 114 could be shut down by instructing downstream processing to ignore the converter by ID. In this way, the serial interface characteristics are not affected.

The data is to be output in the sequence it was taken (i.e. converter). If rising and falling edge sampling is enabled, downstream processing (off the microchip) can recover a group that each converter was assigned to and properly sequence the data by these groups. The exchange of information about A/D converter groupings, stagger clock steps, calibration results, A/D sequencing and other forms of organizational and signal processing algorithmic controls is provided through the management system 116. The ability to chose the master clock frequency and the stagger steps gives us the ability to better tune frequency, in contrast to a fixed clock and stagger step system. Therefore communication with the CADC SoC from the downstream processor through the management system 116 may be an important feature of the exemplary embodiments.

It should be understood that while digital methods of stagger control may be implemented, analog methods of stagger control could also be used be implemented. For example, delay gates or varying transmission line lengths may be utilized to achieve a proper stagger step value. It should also be clear that the odd and even set may also have differing stagger clocks.

The above embodiments generally teach CADCs may be improved by organizing clock signals and data management. Uses for this system include radar systems and RF signal measurement systems for military applications. It also may be implemented into commercial wideband receivers, for example, digital television tuners and commercial digital broadcast satellite tuners.

While the foregoing describes exemplary embodiments and implementations, it will be apparent to those skilled in the art that various modifications and variations can be made to the present invention without departing from the spirit and scope of the invention.

What is claimed is:

1. An analog to digital converter device comprising:
   a plurality of analog to digital converters, each converter configured to receive an analog input signal and output a digital data sequence,
   wherein a portion of the plurality of converters are responsive to a rising edge of a clock signal for converting the analog signal to digital data, and a remaining portion of the converters are responsive to a falling edge of a clock signal for converting the analog signal to digital data.

2. The analog to digital converter device of claim 1, further comprising a clock generation system for generating a plurality of clock signals, the plurality of clock signals provided to a respective one of the plurality of analog to digital converters.

3. The analog to digital converter device of claim 2, wherein the plurality of clock signals comprise a base clock signal and at least one staggered clock signal delayed with respect to the base clock signal by a stagger period.

4. The analog to digital converter device of claim 3, wherein the at least one staggered clock signal comprises a plurality of successive staggered clock signals, each successive staggered clock signal delayed with respect to a preceding staggered clock signal by a stagger period.

5. The analog to digital converter device of claim 1, further comprising a plurality of track and hold amplifiers, each of the amplifiers provided with a respective clock signal and configured to receive the analog input signal and output an analog signal to a respective analog to digital converter.

6. The analog to digital converter device of claim 5, wherein each of the plurality of amplifiers is arranged in series with a respective converter forming a plurality of amplifier and converter pairs.

7. The analog to digital converter device of claim 6, wherein each of the amplifier and converter pairs is provided with a respective clock signal.

8. The analog to digital converter device of claim 1, further comprising a signal distribution system configured to receive the analog input signal and distribute the input signal to each of the plurality of converters.

9. The analog to digital converter device of claim 1, further comprising a plurality of filters operative to correct for amplitude and phase errors reflected within the digital data output of the converters.

10. The analog to digital converter device of claim 1, further comprising a data management device configured to receive and combine the outputs of the plurality of converters into a common data stream.

11. The analog to digital converter device of claim 10, wherein the data management device identifies digital data received from each of the plurality of converters as belonging to at least one of two sub-groups, a first sub-group comprising data received from converters responsive to the rising edge of the clock signal, and a second sub-group comprising data received from converters responsive to the falling edge of the clock signal.

12. The analog to digital converter device of claim 11, wherein the data management device appends an identifying address to a portion of the received digital data.

13. The analog to digital converter device of claim 4, further comprising a clock management system, the clock management system operative to selectively alter the stagger periods of the staggered clock signals.

14. The analog to digital converter device of claim 13, wherein the clock management system alters the stagger periods of the staggered clock signals according to a predetermined set of stored values.

15. The analog to digital converter device of claim 14, wherein the clock management system is responsive to a processor for selecting an appropriate stagger period according to desired signal processing parameters.

16. The analog to digital converter device of claim 1, wherein the device is disposed on an integrated circuit chip.

17. The analog to digital converter device of claim 1, wherein the plurality of analog to digital converters are controlled by a management system.

18. The analog to digital converter device of claim 17, wherein the management system is operative to calibrate each of the plurality of analog to digital converters.

19. The analog to digital converter device of claim 17, wherein the management system is operative to fault test the device.

20. The analog to digital converter device of claim 17, wherein the management system is operative to control the organization and clocking of the plurality of analog to digital converters so as to appear to function as a single device to a radio system responsive to tuning commands.

21. The analog to digital converter device of claim 17, wherein the clock management system comprises a control port for at least one of sending and receiving at least one of information and tuning commands between the management system and other systems.

22. An integrated circuit comprising:
a clock phase generation device configured to generate N-clock signals, each of the N-clock signals having a rising edge and a falling edge, and
N-analog to digital converters configured to generate N-sample digital outputs, each of the N-analog to digital converters being coupled to one of the N-clock signals and configured to generate one of the N-sample digital outputs based on a corresponding one of the N-clock signals and an RF input signal;
wherein a portion of the N-analog to digital converters are responsive to generate N-sample digital outputs on the rising edge of a clock signal and a remaining portion of the N-analog to digital converters responsive to generate N-sample digital outputs on the falling edge of a clock signal.

23. An integrated circuit comprising:
a plurality of analog to digital converters, each converter configured to receive an analog input signal and output digital data;
a clock generation system for generating a plurality of successive clock signals, each of the clock signals offset with respect to one another by a stagger period, wherein each of the plurality of converters are provided with a respective clock signal, and
a clock management system, the clock management system operative to selectively alter the stagger period of each of the staggered clock signals;
wherein a first portion of the plurality of converters are responsive to a rising edge of a clock signal and a second portion of the converters are responsive to a falling edge of a clock signal.

24. An integrated circuit comprising:
a plurality of analog to digital converters, each converter configured to receive an analog input signal and output digital data;
a clock generation system for generating a plurality of successive clock signals wherein each of the plurality of converters are provided with a respective clock signal, and
a data management system, the data management system configured to identify digital data output by each of the plurality of analog to digital converters as belonging to one of two groups, a first group comprising output data received from converters responsive to a rising edge of the clock signal, and a second group comprising output data received from converters responsive to a falling edge of the clock signal.

25. A method of increasing the signal to noise ratio of a complex analog to digital converter, the method comprising:
generating a plurality of clock signals, each of the clock signals having a rising edge and a falling edge,
providing a plurality of analog to digital converters with a respective one of the plurality of clock signals, and
converting an analog input signal supplied to the plurality of analog to digital converters to a digital data stream, wherein a portion of the analog to digital converters are responsive to the rising edge of a respective clock signal and a remaining portion of the analog to digital converters are responsive to the falling edge of a respective clock signal for converting the analog signal.

26. The method of claim 25, wherein the step of generating a plurality of clock signals further comprises generating a plurality of time-staggered clock signals offset with respect to one another by a stagger period.

27. The method of claim 26, further comprising the step of altering the stagger period between the plurality of clock signals according to desired signal processing parameters.

28. The method of claim 25, further comprising the step of identifying each digital data stream created by each of the plurality of analog to digital converters.

* * * * *